United States Patent [19]

Park

[11] Patent Number: 5,956,283
[45] Date of Patent: Sep. 21, 1999

[54] METHOD OF READING A FLASH MEMORY CELL AND A READ VOLTAGE GENERATING CIRCUIT

[75] Inventor: Joo Weon Park, Seoul, Rep. of Korea

[73] Assignee: Hyundai Electronics Industries, Co., Ltd., Kyungki-do, Rep. of Korea

[21] Appl. No.: 08/998,317

[22] Filed: Dec. 24, 1997

[30] Foreign Application Priority Data

Dec. 28, 1996 [KR] Rep. of Korea ...................... 96-74991

[51] Int. Cl.$^6$ .................................................. G11C 11/34
[52] U.S. Cl. .......................... 365/226; 323/281; 323/313; 327/540; 327/538; 365/189.06; 365/185.18
[58] Field of Search .............................. 365/189.06, 226, 365/185.18; 323/281, 313; 327/538, 540

[56] References Cited

U.S. PATENT DOCUMENTS

| | | |
|---|---|---|
| 5,280,446 | 1/1994 | Moi et al. ............................ 365/185.01 |
| 5,767,735 | 6/1998 | Javanifard et al. ..................... 327/536 |
| 5,776,810 | 7/1998 | Guterman et al. ...................... 438/258 |
| 5,801,493 | 9/1998 | Choi .................................. 365/185.28 |

FOREIGN PATENT DOCUMENTS 3-34198   2/1991   Japan .............................. G11C 16/06

*Primary Examiner*—Viet Q. Nguyen
*Attorney, Agent, or Firm*—Scott C. Harris, Esq.

[57] ABSTRACT

The present invention disclosed a method of reading a flash memory cell and a read voltage generating circuit which can perform a stable read operation regardless of a power supply voltage by applying a voltage of 2V to the source, a voltage of 0V to the drain, a power supply voltage Vcc to the select gate, and a clamping voltage output from the read voltage generating circuit to the control gate upon a read operation of a split gate flash memory cell.

1 Claim, 3 Drawing Sheets

METHOD OF READING A FLASH MEMORY CELL AND A READ VOLTAGE GENERATING CIRCUIT

BACKGROUND OF THE INVENTION

1. Field of the invention

The present invention relates to a method of reading a flash memory cell and a read voltage generating circuit which can perform a stable read operation regardless of a power supply voltage and can also perform a read operation rapidly when a program or an erase operation mode is shifted to a read mode.

2. Description of the Prior Art

FIG. 1 shows a structure of a conventional flash memory cell. A power supply voltage Vcc is applied to a gate VG. In this case, the threshold voltage Vt of a program cell becomes a program voltage Vcc+1V. That is, when a program operation is performed with a low voltage, the program threshold voltage can be reduced in proportion to the low voltage. However, if a read operation is performed for this cell with a high power supply voltage Vcc, there is a problem that a read speed is degraded or defect cells is caused, thereby lowering read margins.

Also, when a read operation of a split gate type flash memory cell is performed, since a power supply voltage Vcc is applied to a select gate and a control gate, read margins are varied in proportion to variation of a power supply voltage Vcc.

SUMMARY OF THE INVENTION

It is an object of the present invention to provide a method of a reading a flash memory cell and a read voltage generating circuit which can perform a stable read operation regardless of a power supply voltage.

To achieve the above object, a read voltage generating circuit of a flash memory cell comprises a reference voltage generating circuit for outputting a first and a second constant reference voltage regardless of variations of a power supply voltage; a first voltage regulating circuit for keeping at initial an output voltage to a clamping voltage in response to the first reference voltage being the output of the reference voltage generating circuit upon a standby mode of the cell; a second voltage regulating circuit for outputting a stable clamping voltage in response to the first reference voltage being the output of the reference voltage generating circuit and a first enable signal for a read operation upon a read mode; a third voltage regulating circuit for keeping constant the output voltage in response to the first reference voltage being an output of the reference voltage generating circuit and a second enable signal for a read operation; a compare circuit for outputting a first control voltage in response to a clamping voltage being an output of the second voltage regulating circuit, an output voltage of the third voltage regulating circuit, the second reference voltage being an output of the reference voltage generating circuit and the second enable signal; an output voltage driving circuit for outputting a second control voltage in response to the first control voltage being an output of the compare circuit and the second reference voltage being an output of the reference voltage generating circuit; and a power supply circuit for rapidly raising the clamping voltage being an output of the second voltage regulating circuit in response to an output voltage of the output voltage driving circuit.

BRIEF DESCRIPTION OF THE DRAWINGS

Other objects and advantages of the present invention will be understood by reading the detailed explanation of the embodiment with reference to the accompanying drawings in which:

FIG. 3 is a detailed circuit diagram of a read voltage generating circuit for generating a clamping voltage; and.

DETAILED DESCRIPTION OF THE INVENTION

Below, the preferred embodiment of the present invention will be explained by reference to the accompanying drawings.

Figure 1:
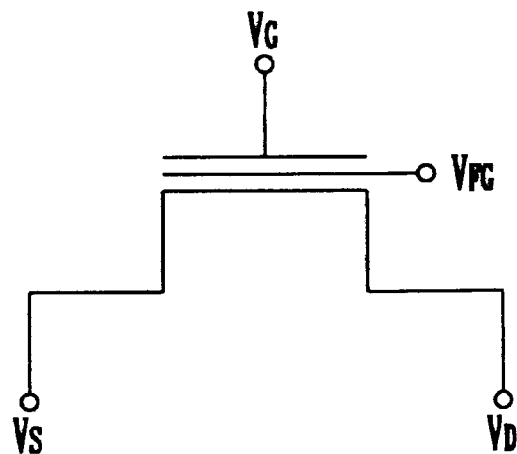
FIG. 1 shows a structure of a conventional stack gate type flash memory cell.
Figure 2:
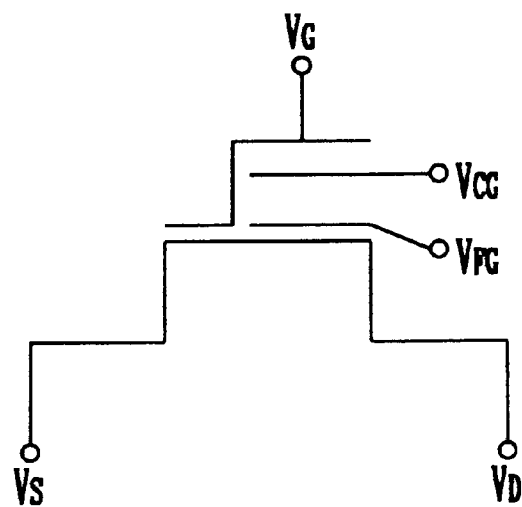
FIG. 2 shows a structure of a split gate type flash memory cell applicable to the present invention.

FIG. 2 shows a structure of a split gate flash memory cell applicable to the present invention. The split gate type flash memory cell is consisted of a select gate VSG, a control gate VCG, a floating gate VFG, and a source and drain electrodes VS and VD.

Upon a read operation of the split gate type flash memory cell, voltage conditions of the electrodes are as follows.

Figure 3:
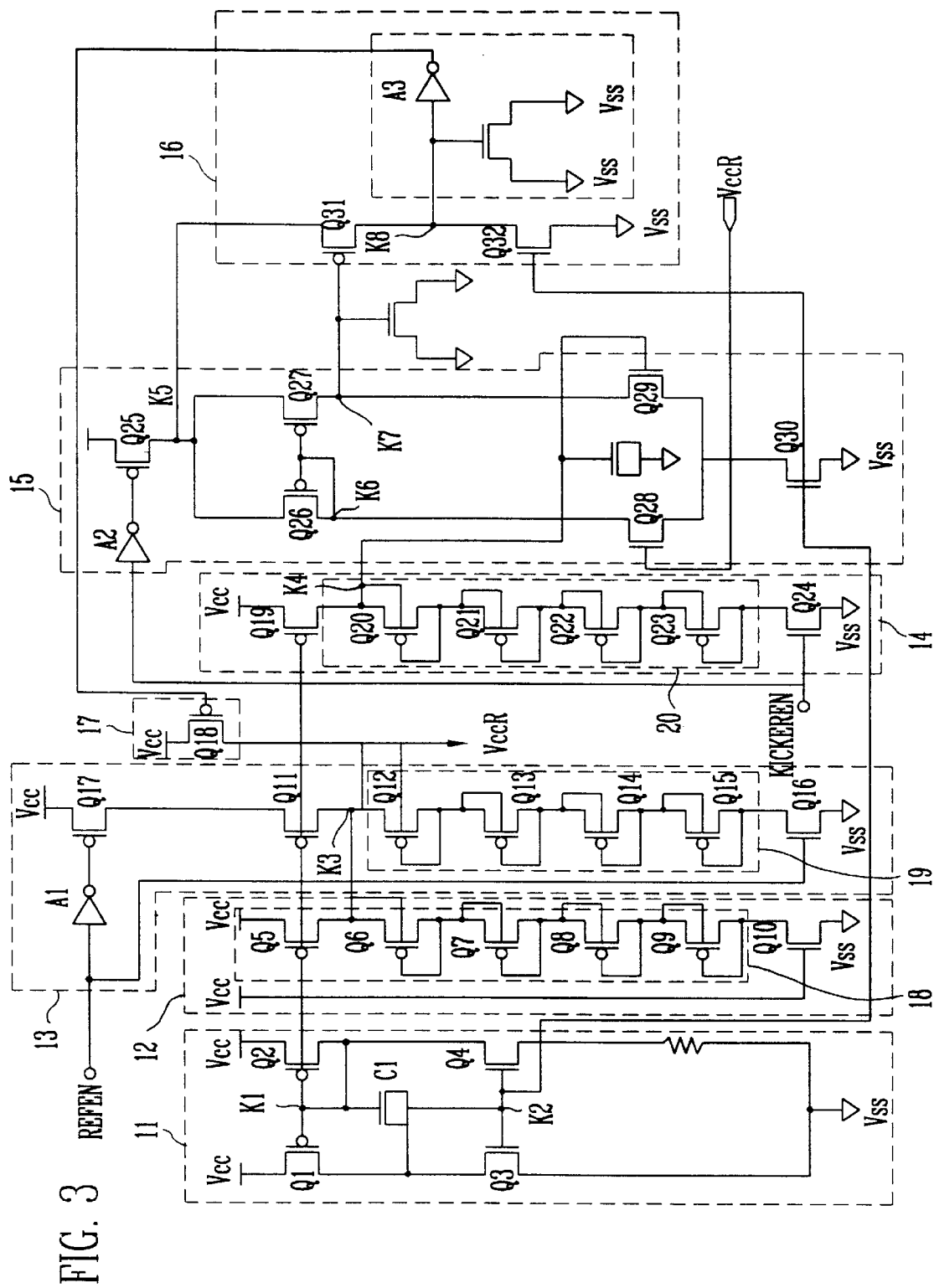

Voltage of 2V is applied to the source electrode VS, voltage of 0V is applied to the drain electrode VD, a power supply voltage is applied to the select gate VSG, and a clamping voltage generated from a read voltage generating circuit shown in FIG. 3 is applied to the control gate VCG.

On the other hand, upon a program, the distributions of the threshold voltage Vt have a constant fixed number distributions according to conditions of the cell or the power supply voltage. That is, the threshold voltage Vt is lowered so that a cell is programmed with a low power supply voltage, and when a read operation of this cell is performed with a high voltage, the voltage surpasses the threshold voltage Vt of the program cell, therefore, a leakage current flows through the cell.

However, when a read operation according to the present invention is performed, a clamping voltage supplied from the read voltage generating circuit is applied to the control gate so that a leakage current can be prevented. Due to this, read operation margins may become greater and also inconvenience of an over program can be solved.

In addition, since the clamping voltage is applied to the control gate, a constant voltage can be maintained upon a read operation even though a cell corresponding to a certain address is accessed.

FIG. 3 is a detailed circuit diagram of a read voltage generating circuit according to the present invention.

The read voltage generating circuit comprises a reference voltage generating circuit 11 for outputting a constant voltage regardless of variations of a power supply voltage Vcc, a first voltage regulating circuit 12 to which an initial output voltage of the reference voltage generating circuit 11 is input upon a standby mode for keeping the output voltage to a clamping voltage VccR, and a second voltage regulating circuit 13 for outputting a stable clamping voltage VccR in response to an output voltage of the reference voltage generating circuit 11 and a first enable signal REFEN for a read operation upon a read mode. The read voltage generating circuit also comprises a third voltage regulating circuit 14 for keeping the output voltage to a constant voltage in response to an output voltage of the reference voltage generating circuit 11 and a second enable signal KICK-EREN for a read operation, a compare circuit 15 for outputting a first control voltage in response to a clamping voltage VccR being an output voltage of the second voltage regulating circuit 13, an output voltage of the third voltage regulating circuit 14, an output voltage of the reference voltage generating circuit 11 and the second enable signal KICKEREN, an output voltage driving circuit 16 for outputting a second control voltage in response to the first control voltage being an output of the compare circuit 15 and an output voltage of the reference voltage generating circuit 11, and a power supply circuit 17 for rapidly raising the clamping voltage VccR being an output voltage of the second voltage regulating circuit 13 in response to the second control voltage being an output voltage of the output voltage driving circuit 16.

The operation of the read voltage generating circuit constructed as explained above will be explained in detail as follows.

In a program or a erase mode, the first enable signal REFEN maintains in a low state and the second enable signal KICKEREN for recovering the read voltage maintains in a high state.

At this tim, a second node K2 of the reference voltage generating circuit 11 maintains a voltage Vtn+ΔV which is higher than the threshold voltage Vtn of NMOS transistors Q3 and Q4, and a first node K1 maintains a voltage Vcc−(Vtp+ΔV) which is lower than voltage subtracting the threshold voltage Vtp of PMOS transistors Q1 and Q2 from the power supply voltage Vcc. Therefore, the NMOS transistors Q3 and Q4 and the PMOS transistors Q1 and Q2 are turned on weakly. Also, a PMOS transistor Q5 of the first voltage regulating circuit 12, to which the voltage of the first node K1 is input, is turned on weakly, and a NMOS transistor Q10 to which the power supply voltage Vcc is input is turned on. Therefore, the voltage of the third node K3 to which the power supply voltage Vcc is supplied through the PMOS transistor Q5 is determined by the PMOS transistors Q6 to Q9 consisting a first diode chain 18.

For example, assuming that the threshold Vtp of each of the PMOS transistors Q6 to Q9 of the first diode chain 18 is 1V, since the first diode chain 18 is consisted of four (4) PMOS transistors, the voltage of a fourth node K4 maintains 4V. That is, even though the power supply voltage Vcc is raised to more than a given voltage, a voltage of a constant saturation state can be maintained.

In the second voltage regulating circuit 13, a PMOS transistor Q17 to which the first enable signal REFEN for a read operation is input though a first inverter A1, and a NMOS transistor Q16 to which the first enable signal REFEN for the read operation is input are turned off so that the PMOS transistor Q17 and the NMOS transistor Q16 are not operated.

Meanwhile, a PMOS transistor Q19 of the third voltage regulating circuit 14, to which a voltage of the node K1 being output of the reference voltage generating circuit 11 is input, and the NMOS transistor Q24 to which the second enable signal KICKEREN for recovering the read voltage is input are turned on. Therefore, the voltage of the fourth node K4 to which the power supply voltage Vcc is applied through the PMOS transistor Q19 is determined by PMOS transistors Q20 to Q23 consisting a third diode chain 20. Then, NMOS transistors Q30, Q29 and Q28 to which the voltage of the second node K2 being the output of the reference voltage generating circuit 11, the voltage of the fourth node K4 being the output of the third voltage regulating circuit 14 and the clamping voltage VccR are input, respectively, are turned on. Also, a PMOS transistor Q25 to which the second enable signal KICKEREN for recovering the read voltage is input through a second inverter A2 is turned on so that the voltage of a fifth node K5 maintains at a high state, and PMOS transistors Q26 and Q27 are turned on.

At this time, a voltage of a sixth node K6, which is the output of the compare circuit 15, maintains at low state and a voltage of a seventh node K7 maintains at high state. Therefore, a PMOS transistor Q31 of the output voltage driving circuit 16, to which a voltage of the seventh node K7 being the output of the compare circuit 15 and the voltage of the second node K2 being the output of the reference voltage generating circuit 11, is turned off, a NMOS transistor Q32 is turned on. As a result, the voltage of a eighth node K8 being the output of the output voltage driving circuit 16, becomes a low state by means of the NMOS transistor Q32. At this time, a PMOS transistor Q18 being the power supply circuit 17, to which the voltage of the eighth node K8 is input through a third inverter A3, is turned off.

As described above, in a program or a erase mode, the PMOS transistor Q18 being the power supply circuit 17 for rapidly recovering a read voltage is turned off.

Thereafter, in a state before the read mode, the first enable signal REFEN for a read operation is shifted to a low state and the second enable signal KICKEREN for recovering a read voltage is shifted from a low state to a high state. At this time, the PMOS transistor Q19 of the third voltage regulating circuit 14 and the NMOS transistor Q24 to which a voltage of the first node K1 being an output of the reference voltage generating circuit 11 and the second enable signal KICKEREN for recovering the read voltage are input, respectively, are turned on. Therefore, the voltage of the fourth node K4 maintains a constant voltage by means of a third diode chain 20. Thereafter, the NMOS transistors Q30, Q29 and Q28 of the compare circuit 15, to which the voltage of the second node K2 being the output of the reference voltage generating circuit 11, the voltage of the fourth node K4 being the output of the third voltage regulating circuit 14 and the clamping voltage VccR are input, respectively, are all turned on. Also, the PMOS transistor Q25 to which the second enable signal KICKEREN for recovering the read voltage is input through the second inverter A2 is turned on so that the voltage of the fifth node K5 becomes a high state and the PMOS transistors Q26 and Q27 are turned on. At this time, the voltage of the sixth node K6 being the output of the compare circuit 15 becomes a high state and the voltage of the seventh node K7 becomes a low state. Therefore, the PMOS transistor Q31 of the output voltage driving circuit 16 and the NMOS transistor Q32 to which the voltage of the seventh node K7 being the output of the compare circuit 15 and the voltage of the second node K2 being the output of the reference voltage generating circuit 11 are input, respectively, are turned on.

At this time, the PMOS transistor Q31 has a very large current driving capability compared to the NMOS transistor Q32. Therefore, the voltage of the eighth node K8 being the output of the output voltage driving circuit 16 becomes a high state by means of the PMOS transistor Q31 even though the NMOS transistor Q32 is turned on. At this time, the voltage of the eighth node K8 becomes a low state through the third inverter A3, and the PMOS transistor Q18 being the power supply circuit 17 to which the voltage of the low state is input is turned on. Therefore, in a state before the read mode, as the PMOS transistor Q18 being the power supply circuit 17 is turned on, the output voltage of the read voltage generating circuit is rapidly raises.

Thereafter, in a read mode, the first enable signal REFEN for operating the read operation is shifted from a low state to a high state, and the second enable signal KICKEREN for recovering the read voltage is shifted from a high state to a low state.

At this time, the PMOS transistor Q11 of the second voltage regulating circuit 13 is weakly turned on by the voltage of the first node K1 of the reference voltage generating circuit 11. Also, the PMOS transistor Q17 to which the first enable signal REFEN for the read operation is input through the first inverter A1 and the NMOS transistor Q16 to which the first enable signal REFEN for the read operation is input are turned on. Therefore, the third node K3 to which the power supply voltage Vcc is supplied through the PMOS transistor Q17 outputs a stable clamping voltage VccR by means of the PMOS transistors Q12 through Q15 consisting the second diode chain 19.

That is, even though the power supply voltage Vcc rises more than a constant voltage, the clamping voltage VccR can maintain a constant saturated state due to the PMOS transistors Q12 to Q15 consisting the second diode chain 19.

As described above, the read voltage generating circuit according to the present invention can be used to rapidly recover a control gate voltage into a read operation voltage before a read operation after performing a read operation by applying a program or an erase operation voltage to a control gate of a cell, and is operated only for a given time right before the read operation.

Figure 4:
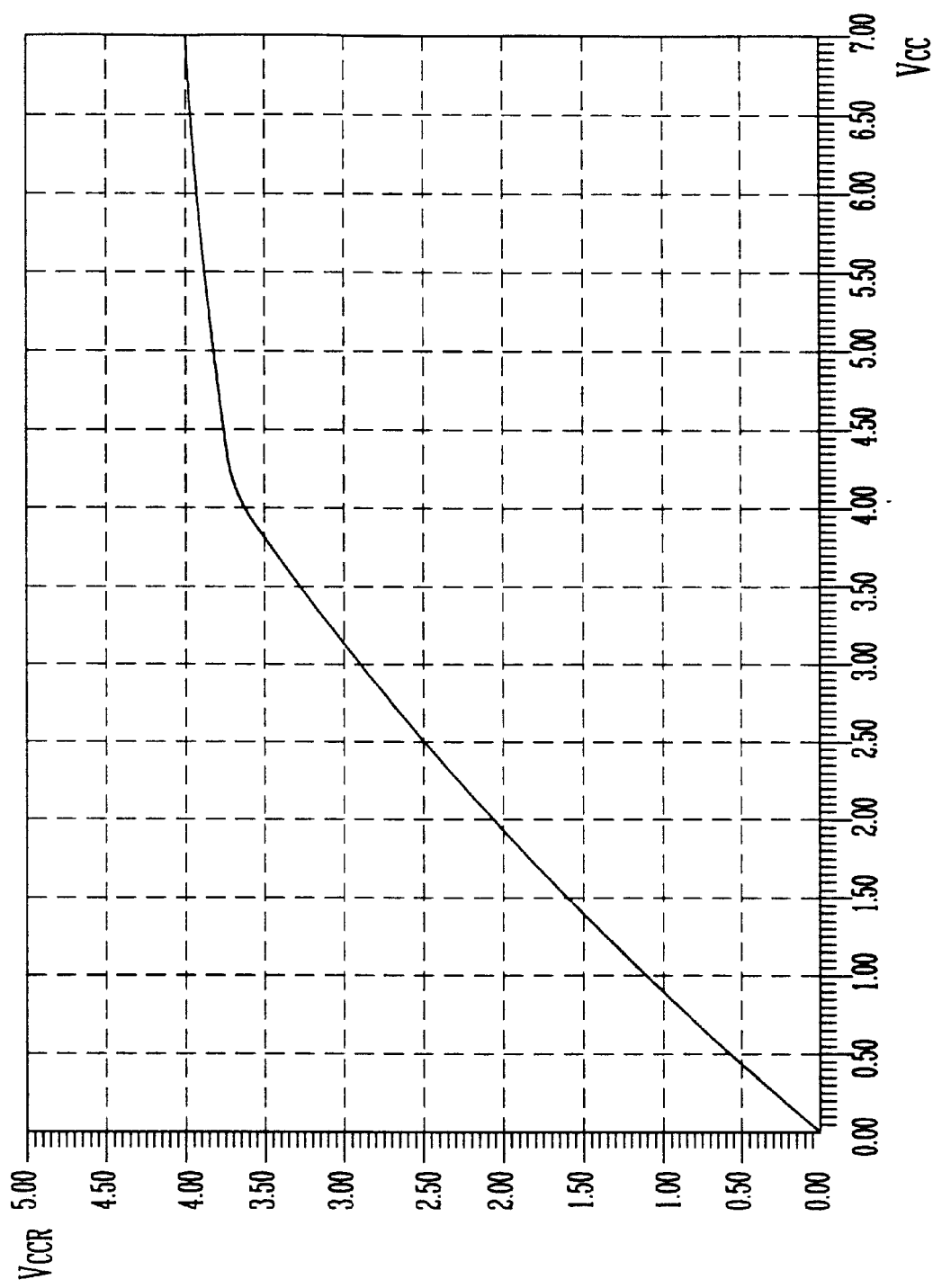
FIG. 4 is a characteristics view of a clamping voltage according to the present invention.

FIG. 4 shows a clamping voltage characteristics view generated by the present invention. As can be seen from FIG. 4, the clamping voltage VccR maintains constantly at about 4V even though the power supply voltage Vcc is increased more than 4V.

According the present invention, a stable read operation can be performed regardless of a power supply voltage by applying a power supply voltage to a select gate and applying a clamping voltage to the control gate when a split gate type flash memory cell is read. Also, a rapid read operation can be performed when a program or an erase mode is shifted to a read mode. The foregoing description, although described in its preferred embodiments with a certain degree of particularity, is only illustrative of the principle of the present invention. It is to be understood that the present invention is not to be limited to the preferred embodiments disclosed and illustrated herein. Accordingly, all expedient variations that may be made within the scope and spirit of the present invention are to be encompassed as further embodiments of the present invention.

What is claimed is:

1. A read voltage generating circuit of a flash memory cell, comprising:

a reference voltage generating circuit for outputting a first and a second constant reference voltage regardless of variations of a power supply voltage;

a first voltage regulating circuit for keeping at initial an output voltage to a clamping voltage in response to said first reference voltage being the output of said reference voltage generating circuit upon a standby mode of the cell;

a second voltage regulating circuit for outputting a stable clamping voltage in response to said first reference voltage being the output of said reference voltage generating circuit and a first enable signal for a read operation upon a read mode;

a third voltage regulating circuit for keeping constantly the output voltage in response to said first reference voltage being an output of said reference voltage generating circuit and a second enable signal for a read operation;

a compare circuit for outputting a first control voltage in response to a clamping voltage being an output of said second voltage regulating circuit, an output voltage of said third voltage regulating circuit, said second reference voltage being an output of said reference voltage generating circuit and said second enable signal;

an output voltage driving circuit for outputting a second control voltage in response to said first control voltage being an output of said compare circuit and said second reference voltage being an output of said reference voltage generating circuit; and a power supply circuit for rapidly raising the clamping voltage being an output of said second voltage regulating circuit in response to an output voltage of said output voltage driving circuit.

* * * * *